(12) United States Patent
Waldie et al.

(10) Patent No.: US 6,480,019 B2
(45) Date of Patent: Nov. 12, 2002

(54) MULTIPLE VOTED LOGIC CELL TESTABLE BY A SCAN CHAIN AND SYSTEM AND METHOD OF TESTING THE SAME

(75) Inventors: Arthur Howard Waldie, Albuquerque, NM (US); Robert Ward James, Albuquerque, NM (US); Kuo-Chuan Chang, Renton, WA (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 09/829,130

(22) Filed: Apr. 9, 2001

(65) Prior Publication Data

US 2002/0013928 A1 Jan. 31, 2002

Related U.S. Application Data

(60) Provisional application No. 60/203,297, filed on May 11, 2000.

(51) Int. Cl.[7] .............................................. H03K 19/00
(52) U.S. Cl. .............................. 326/16; 326/9; 326/11; 326/12; 326/14
(58) Field of Search ................... 326/8, 1, 16; 327/144, 327/145, 295

(56) References Cited

U.S. PATENT DOCUMENTS

| | | | | |
|---|---|---|---|---|
| 4,587,445 A | * | 5/1986 | Kanuma | 307/443 |
| 6,118,297 A | * | 9/2000 | Schenck | 326/35 |
| 6,127,864 A | * | 10/2000 | Mavis et al. | 327/114 |

* cited by examiner

*Primary Examiner*—Michael Tokar
*Assistant Examiner*—Anh Tran
(74) *Attorney, Agent, or Firm*—James M. Rashid; Calfee, Halter & Griswold LLP

(57) ABSTRACT

A multiple voted integrated circuit logic cell testable by a scan chain comprises: an odd plurality of latching registers, each register having a data input for receiving a scan chain data signal and capable of latching the scan chain data signal and generating an output signal representative thereof; a multiple vote circuit governed by the output signals of the registers for generating an output signal of the logic cell; and a circuit coupled to each latching register for altering selectively the scan chain data signal input thereto. A scan chain test system for and method of testing at least one multiple voted logic cell of the aforementioned type are also disclosed.

26 Claims, 3 Drawing Sheets

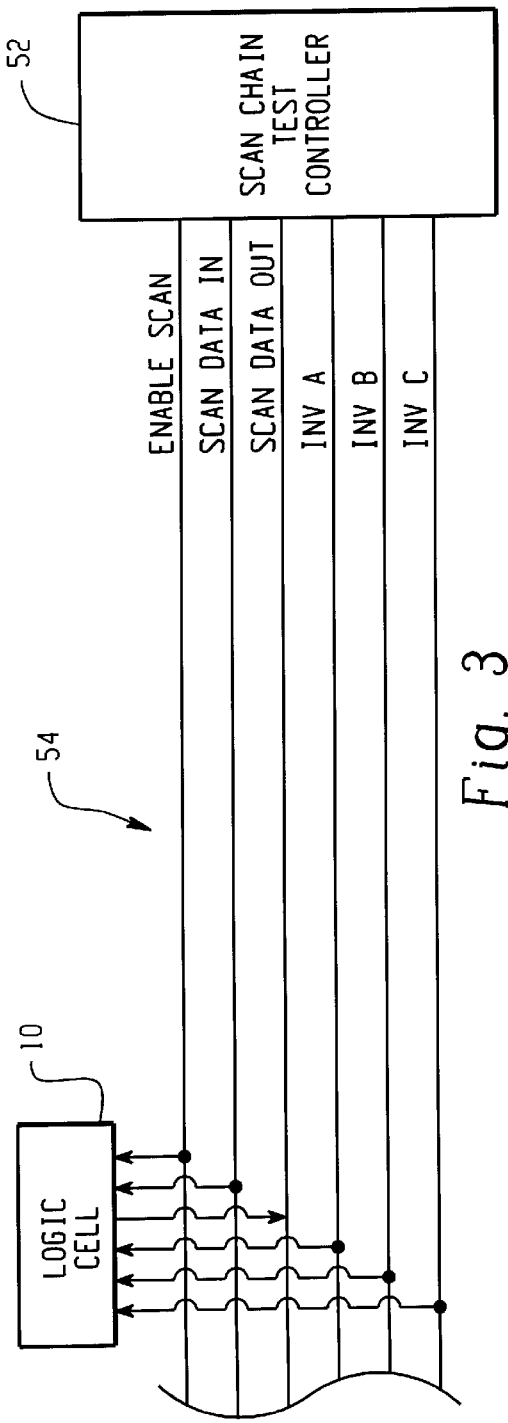

MULTIPLE VOTED LOGIC CELL TESTABLE BY A SCAN CHAIN AND SYSTEM AND METHOD OF TESTING THE SAME

This application claims priority from U.S. Provisional Application Ser. No. 60/203,297 filed May 11, 2000.

BACKGROUND OF THE INVENTION

The present invention is directed to multiple voted logic cells of integrated circuits, in general, and more particularly, to a multiple voted integrated circuit logic cell testable by a scan chain and a system and method of testing the same.

Generally, in the final design phases of an integrated circuit (IC), a series of scan chains are designed into the IC, preferably by conventional software programs, to permit the fabricator or foundry to test the various logic cells of the manufactured IC as one of the final steps in the production thereof. Conventional scan chains are primarily designed to test individual logic cells, like flip-flops and the like, for example. That is, when a scan chain data signal is applied to a data input of a logic cell and latched by the cell, the scan chain expects the output to respond correctly in order to determine whether or not the cell is faulty. The problem is that multiple voted logic cells by their very design will always respond correctly to a change to a data input thereof, even though one of the individual registers is faulty.

More specifically, a multiple voted logic cell may be comprised of an odd plurality of latching registers configured in parallel with the data input signal of the logic cell coupled to the data inputs thereof. The latching circuits are operated synchronously by a common clock signal to capture and store the same time sample of the input data signal. The data outputs of the latching registers may be coupled to a majority vote circuit which generates the stored signal of the logic cell. If any one of the latching registers is faulty or produces an erroneous output, it will be out-voted by the other two which produce the same and correct output. Accordingly, the storage cell output will always respond correctly to a scan chain data signal, even though one of the individual registers is faulty.

It may be possible to treat the individual registers of the logic cell separately, that is, as individual logic cells themselves, but this would require substantial additional circuitry to each such logic cell at a substantial cost in terms of money, substrate area and possibly performance. But, even if this were possible, this solution would not be able to test the peripheral circuitry to the latching registers of the logic cell, especially the majority vote output circuit, for example. Note that if a fault is passed undetected through the foundry scan chain testing, then only one additional fault in the field operation of the IC may render the logic cell faulty and unusable. Another problem with creating special scan chain testing for these multiple voted logic cells is the substantial new software that would have to be created since the current scan chain testing software is not adequate for testing the individual latching registers of such a logic cell.

Accordingly, it is desirable to provide a multiple voted logic cell design which is testable with the current scan chain software in order to fully test and determine faults within the circuitry of such logic cells. The present invention provides for such a logic cell design and a system and method of testing the same without having to alter substantially the conventional scan chain testing software.

SUMMARY OF THE INVENTION

In accordance with one aspect of the present invention, a multiple voted integrated circuit logic cell testable by a scan chain comprises an odd plurality of latching registers, each register having a data input for receiving a scan chain data signal and capable of latching the scan chain data signal and generating an output signal representative thereof; a multiple vote circuit governed by the output signals of said registers for generating an output signal of said logic cell; and circuit means coupled to each latching register for altering selectively the scan chain data signal input thereto.

In accordance with another aspect of the present invention, a scan chain test system is provided for testing at least one multiple voted logic cell of the aforementioned type. The system comprises a scan chain test controller operable to apply the scan chain data signal to the at least one logic cell of an integrated circuit and control the value thereof. The controller is further operable to control the circuit means of the logic cell for altering selectively the scan chain data signal input to each latching register thereof and for receiving and analyzing the logic cell output signals from said at least one logic cell in response to the applied scan chain data signal and the controlled selective alterations thereof to determine a fault in said at least one logic cell.

In accordance with yet another aspect of the present invention, a method of scan chain testing at least one multiple voted logic cell of the aforementioned type is provided. Such method comprises the steps of: applying the scan chain data signal to the data input of each of the latching registers of at least one multiple voted logic cell of said integrated circuit; controlling the value of the applied scan chain data signal; altering selectively the scan chain data signal input to each latching register; and receiving and analyzing the logic cell output signals from said at least one logic cell in response to the applied scan chain data signal and the selective alterations thereof to determine a fault in said at least one logic cell.

BRIEF DESCRIPTION OF THE DRAWINGS

FIG. 3 is a block diagram schematic of a scan chain test system suitable for embodying another aspect of the present invention.

FIG. 4 is a table exemplifying the operation of the scan chain test system of the present invention.

DETAILED DESCRIPTION OF THE INVENTION

Figure 1:
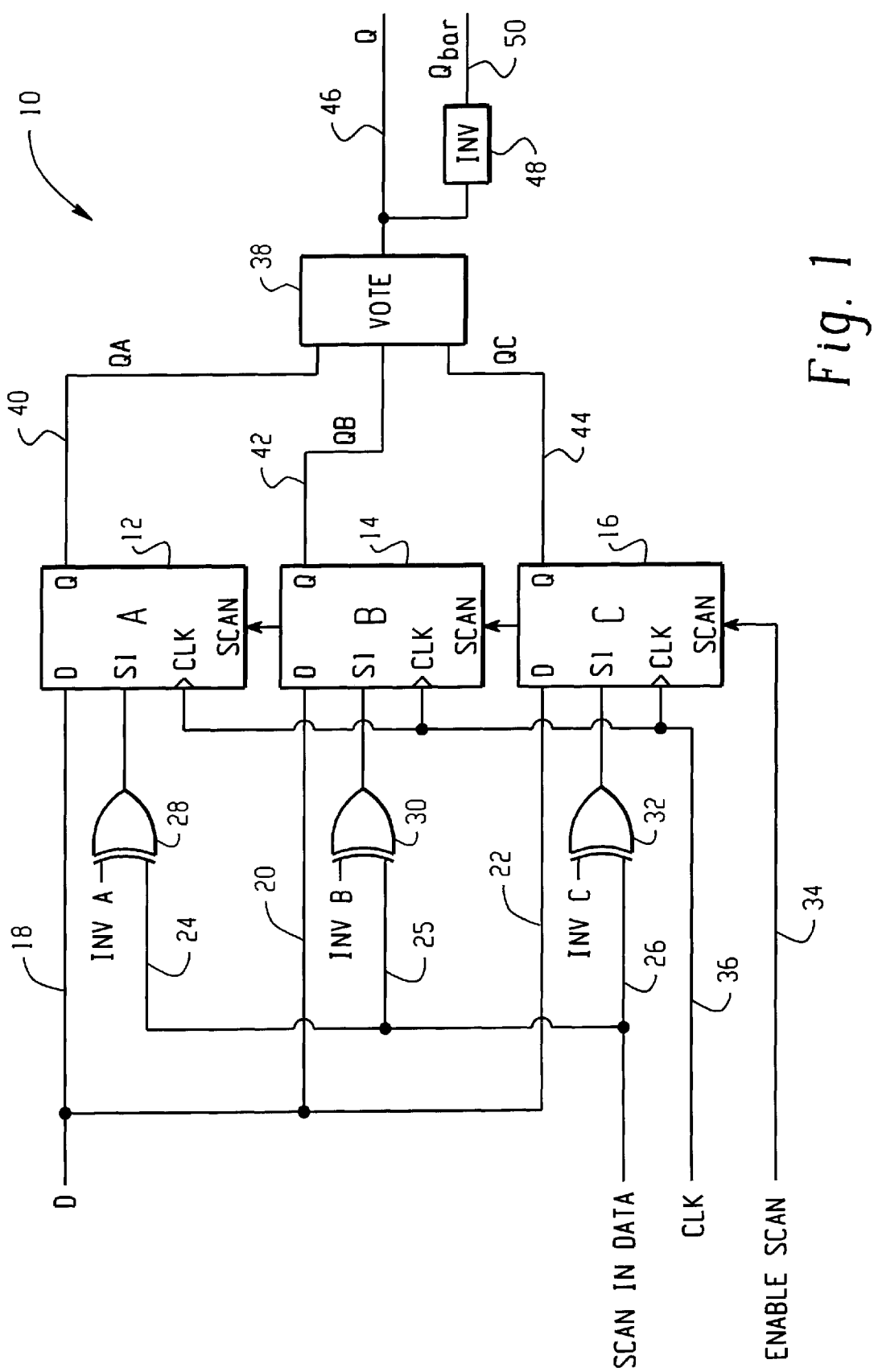
FIG. 1 is a circuit schematic of a multiple voted logic cell suitable for embodying one aspect of the present invention.

The multiple voted integrated circuit logic cell 10 of FIG. 1 is testable by a scan chain and includes an odd plurality of latching registers configured in a parallel circuit. For the present example, only three latching registers 12, 14 and 16 are depicted, but it is understood that the cell may be expanded to include any odd number of registers without deviating from the principles of the present invention. The immediate example is generally referred to as a triple voted logic cell. Each of the registers 12, 14 and 16 of the present embodiment are of the enabled flip-flop type including two inputs labeled as D and S1 which are selectable by a signal applied to an enable input thereof. A data input signal is coupled to each of the D inputs of the registers 12, 14 and 16 over the signal line branches 18, 20 and 22, respectively. A scan chain data signal is coupled to the SI inputs of the three registers 12, 14 and 16 over signal line branches 24, 25 and 26, respectively. Circuitry is disposed in the signal path of the scan chain data signal to the S1 inputs of the multiple registers for altering selectively such signals in order to test the logic cell by the scan chain for faults.

In the present embodiment, this signal altering circuitry includes an exclusive OR gate 28, 30 and 32 disposed in each branch line 24, 25 and 26, respectively. More specifically, one input of each exclusive OR gate is coupled to a corresponding one of the branch lines 24, 25 and 26 over which the scan chain data signal is provided and the output of each OR gate 28, 30 and 32 is coupled to the S1 input of the corresponding register. Another input of each OR gate 28, 30 and 32 is coupled to an independently controlled scan chain signal referred herein as Inv A, Inv B and Inv C, respectively, which signals may be used by a scan chain test controller to select the register of the logic cell to which will be applied the altered scan chain data signal. This will become better understood from the description herein below. While exclusive OR gates are used for the present embodiment, it is understood that other circuits such as a multiplexer with an inverted input, discrete logic, or use of the state of the scan chain itself to complement or not complement the data signal applied to each register of the logic cell, for example, may be used to perform the function of the altering circuitry.

Note that if the scan chain data signal is a digital signal, then by maintaining the control signals Inv A, Inv B, and Inv C at a low or zero binary state, the exclusive OR gates will become transparent to the branch paths 24, 25 and 26. That is, the output of the OR gates will follow the binary states of the scan chain data signal unaltered. However, if any one of the control signals Inv A, Inv B or Inv C is controlled to a high or one binary state, then the corresponding scan chain data signal will be applied inverted to the S1 input of the corresponding register via the associated OR gate.

Continuing with the description of the schematic of FIG. 1, an Enable Scan signal from the scan chain is coupled to the enable inputs of the registers 12, 14 and 16 over the signal line 34. In addition, a clock signal is coupled to the CLK inputs of the registers 12, 14 and 16 over signal line 36. The outputs of the registers 12, 14 and 16 are coupled to corresponding inputs of a multiple (triple vote) circuit 38 over respective signal lines 40, 42 and 44. The circuit 38 is governed by the states of the register output signals to generate a logic cell output signal over signal line 46. An inverter 48 may be used to provide an inverted output signal over signal line 50 to downstream circuitry, if needed.

In operation, the data signal is applied to the D inputs of the registers 12, 14 and 16 and is latched to the outputs thereof by an edge transition of the clocking signal. The voting circuit 38 generates the logic cell output signal from the outputs of the three registers. In the present embodiment, the circuit 38 operates as a majority vote circuit wherein it generates an output based on a majority of its input signals. In other words, if two of the outputs of the three registers 12, 14 and 16 are high or a binary one, circuit 38 will generate a one at its output and vice versa. During scan chain testing, a conventional scan chain controller 52 may be coupled to the logic cell 10 over a scan chain such as the chain shown at 54 in FIG. 3, for example. In this testing mode, the enable scan signal is generated by the controller 52 to cause the registers of the cell 10 to select the scan chain data signal as the current input thereof. The state or value of the scan chain data signal is varied by the controller 52 for testing of the logic cell 10. In addition to controlling the state of the scan chain data signal, the controller may alter selectively the scan chain data signal input to each register through control of the signals Inv A, Inv B and Inv C. These control signals may be controlled manually or by some other device or mechanism without deviating from the present invention. During the testing, the controller 52 receives and analyzes the logic cell output signals in response to the applied scan chain data signal and the selective alterations thereof to determine a fault in the logic cell 10. Other similar multiple voted logic cells of the integrated circuit may be tested by the scan chain in the same manner as just described for cell 10.

More specifically, for testing the logic cell 10 of the present embodiment, the scan chain data signal and the control signals Inv A, Inv B and Inv C may be all initially set at a zero state. Thus, the registers will latch the zero state to the outputs thereof and if all is working properly, the zero state will be generated at the cell output and received by the controller 52 over a scan data output line of the scan chain, for example. Note that a fault in one of the registers will not result in a change in the output state of the logic cell. However, if there is a fault in the peripheral circuitry like the voting circuit 38, for example, then the logic cell output may generate an error state which will be detected by the controller 52. Presuming no fault identified, the Inv C signal may be brought to a high or invert state causing the scan chain data signal to be applied inverted to the S1 input of register 16. If all is working properly, the voting circuit 38 will generate a zero state which will be received and analyzed by controller 52. Thereafter, the Inv C signal is returned to its original non-invert state and Inv B is controlled to its invert state and the scan chain test is run again. Then, Inv B is returned to its non-invert state and Inv A is controlled to an invert state and the scan chain is repeated. At the end of this test run, Inv A is brought back to its original non-invert state. Next, the scan chain data signal is controlled to a high or one state and the scan chain tests for each of the control signal settings are repeated as just described. In this manner, the scan chain test controller using conventional scan chain test software may test, receive and analyze the results of the cumulative test data for each multiple voted logic cell of the integrated circuit and determine if there is a fault to any register or circuitry of any such logic cell.

The table of FIG. 4 exemplifies the accumulation of testing data and fault detection by the scan chain test controller 52 from the aforementioned test sequences. Each row of the table represents a test sequence as described above. Each column of the table represents the binary state of the designated signal. Columns A, B and C represent the data applied to input S1 and latched to the output of each of the three registers 12, 14 and 16, respectively. Column Q represents the state of the logic cell output under no fault conditions. And, each of the other columns represent the state of the logic cell output with a fault condition in one of the registers thereof. For example, the column designated as Q(A→1) means that register 12 is stuck in a high or one state and the column designated as Q(A→0) means that register 12 is stuck in a low or zero state. The other columns represent similar fault conditions for the other registers 14 or B and 16 or C. The bracketed state sequence of each column are unique to and will reveal a register fault condition to the controller 52. For example, a logic cell output sequence of [1, 1, 0] for the first three scan chain test runs of the table of FIG. 4 reveal that register 12 or A is stuck in the high or one state. Likewise, a logic cell output sequence of [0, 0, 1] for the last three scan chain test runs reveal that register 12 or A is stuck in the low or zero state. Faults in the other registers are revealed to the controller 52 in the same manner as shown by the table of FIG. 4.

Figure 2:
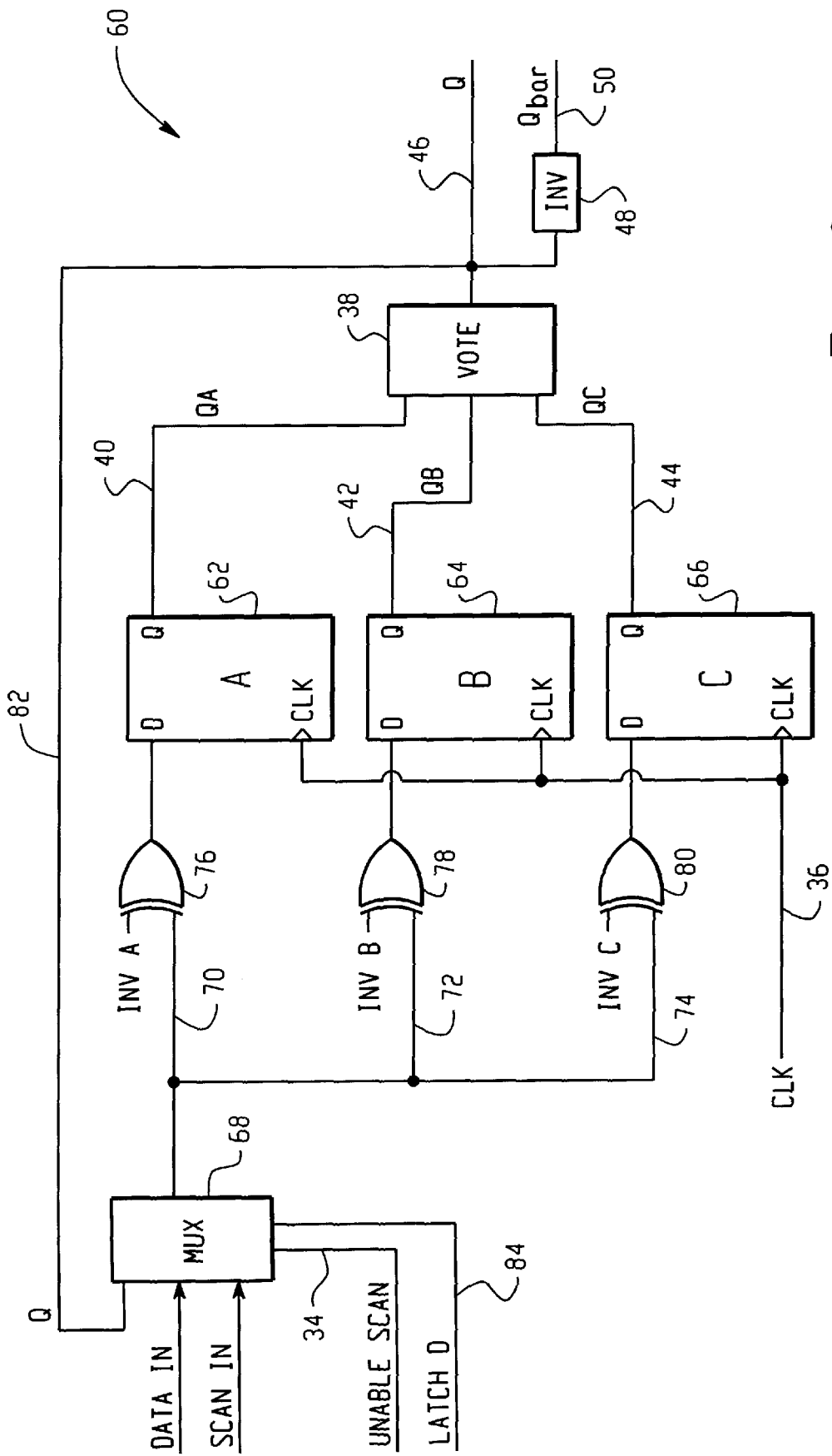
FIG. 2 is a circuit schematic of an alternate embodiment of the present invention.

Some logic cells are comprised of non-enabled registers like that shown in the alternate embodiment of FIG. 2, for example. Referring to FIG. 2, a logic cell 60 is comprised of non-enabled registers 62, 64 and 66 which all have only one data input port D. The circuitry of logic cell 60 downstream of the registers 62, 64 and 66 will have the same reference numerals and remain the same as that described for the logic cell 10 in FIG. 1. In addition, the registers are latched by the same clocking signal CLK over the signal line bearing the same reference numeral 36 as that described for logic cell 10. In order to switch between the data signals and scan chain data signals in the present logic cell embodiment, a multiplexer 68 is provided. The output of multiplexer 68 is distributed to the D inputs of the registers 62, 64 and 66 over signal branch lines 70, 72 and 74, respectively. In each branch line 70, 72 and 74 is disposed an exclusive OR gate 76, 78 and 80, respectively. More particularly, the output of multiplexer 68 is coupled to one input of each Or gate 76, 78 and 80 and the scan chain control signals Inv A, Inv B and Inv C are coupled respectively to another input of Or gates 76, 78 and 80. The signal to be applied to the output of the multiplexer 68 is controlled by the scan enable signal which is coupled to a control line of the circuit 68 over signal line 34. Also in this embodiment, the logic cell output signal is coupled to yet another input of the multiplexer 68 over a signal line 82 and another control line referred to as latch D is coupled to circuit 68 over a signal line 84 which may also be part of the scan chain 54.

In operation, when not being tested, the multiplexer 68 of the logic cell 60 is controlled to pass the data signal to the input ports of the registers 62, 64 and 66. Note that if the control signals Inv A, Inv B and Inv C are kept low, the Or gates 76, 78 and 80 are transparent to the passage of the data signals. In the scan chain testing mode, the multiplexer 68 is controlled by the scan enable signal to pass the scan chain data signal to the date ports D of the registers via OR gates 76, 78 and 80. In this mode scan chain testing may be conducted in the same or similar manner as described above for the logic cell embodiment of FIG. 1. When the testing is complete, the registers may be all refreshed to a correct state based on the state of the logic cell output signal which may be selected by the multiplexer 68 under control of the latch D signal. Note that once testing is complete, the control signals Inv A, Inv B and Inv C are returned to their non-invert states. Accordingly, in the refresh mode, the outputs of all of the registers will be latched to the state of the logic cell output state at each clock cycle. While not shown in FIG. 1, a similar refresh circuit may be embodied in the logic cell 10 using a multiplexer or similar circuitry which may couple the output of the logic cell back to the data ports of the registers when the cell is inactive for a data write cycle.

Accordingly, with the logic cell of the present embodiments, the replacement of a non-voted cell with a multiple voted cell of the present invention can be easily accomplished with a simple net-list modification to the scan chain testing software which will not impact substantially the normal Hardware Description Language (HDL) based design process. Furthermore, the testing process may be automated using internal scan chain registers for selecting and deselecting the exclusive OR or similar circuits for altering the test signals to the various registers of each logic cell. The select signals may also be embodied through use of external pins to the integrated circuit. This cell design may be easily implemented into existing design tools by implementing the cell designs into a library. Still further, the scan chain test method described herein above may be applied to all types of scan chain formats conventionally used to test cells and circuits for proper operation.

It is sometimes necessary to perform in circuit functional self testing and verification of systems prior to their critical operation. In the space industry, for example, it is sometimes required to have equipment perform self tests of their internal circuitry. Although the test coverage during these self test operations is usually limited to a lesser degree than foundry scan chain tests, a large amount of coverage can be still be obtained by having the equipment perform these self test operations. Unfortunately, in a multiple or triple voted system, it is not possible to verify that all of the multiple voted cells are operating properly without special design considerations. The embodiment of FIG. 2 exemplifies a logic cell with attributes to allow for self testing and verification of multiple voted circuits without the foundry scan chain.

In other words, the embodiment of FIG. 2 provides for a configuration that allows multiple voted cells to be tested in both a scan chain environment as well as in an operational environment. For large systems such as microprocessors which have the self test capabilities, for example, external circuits can be used to set the states of the Inv A, Inv B and Inv C signals prior to running a battery of tests designed to locate bad storage cells in the system. A self test that passes without stimulus of the Inv A, Inv B and Inv C signals, but fails with stimulus of some combination of these signals, will indicate a defective element within the multiple voted cell. Manipulation of the data being stored and the Inv A, Inv B and Inv C signals can identify the faulty storage cell within the triple voted cell.

As an example of a self test operation, a processor may perform a test of each single multiple voted cell in a storage register. The processor (not shown) would have control over the state of the data input signal. Referring to FIG. 2, the multiplexer 68 would first be controlled to pass the data input signal to the one input of each of the exclusive OR gates 76, 78 and 80. Thereafter, the control signals Inv A, Inv B and Inv C would be under the control of the processor. The processor may first control Inv A active to invert the input data signal applied to the data input of the latching register 62. This causes the data latched into register 62 to be the inverse of that latched into registers 64 and 66. If the processor sets the input data signal to a binary one, then after the next clock cycle, a binary one will be stored in registers 64 and 66 while a binary zero would be stored in register 62. The processor would then read the resulting logic cell output signal. The processor may restore Inv A to zero and continue to control sequentially the settings of the other two control signals Inv B and Inv C to invert the data input signal to the corresponding latching register and read the resulting cell output in each case. The processor may next set the data input signal to a binary zero and repeat the sequence as described above while reading the cell outputs for each case. Analysis of the read data of the self test (refer to the table of FIG. 4) will allow the processor to determine if the cell is operating properly.

While the present invention has been described herein above in connection with certain specific embodiments, there is no intent to limit the invention to any such embodiment. Accordingly, the present invention should not be limited to any specific embodiment, but rather construed in breadth and broad scope in accordance with the recitation of the appended claims hereto.

What is claimed is:

1. A multiple voted integrated circuit logic cell testable by a test data signed to determine whether or not the cell is faulty, said cell comprising:

odd plurality of latching registers, each register having a data input for receiving said test data signal and capable of latching said test data signal and generating an output signal representative thereof;

multiple vote circuit governed by the output signals of said registers for generating an output signal of said logic cell; and circuit means coupled to each said register for altering selectively the test data signal input thereto.

2. The logic cell of claim 1 wherein the test data signal is a digital signal; and wherein the circuit means comprises means for inverting the test data signal to the data input of at least one selected latching register.

3. The logic cell of claim 2 wherein the inverting means comprises a logic gate coupled to the data input of each latching register, each said logic gate having one data input coupleable to the test data signal and another data input coupled to a control line for selectively causing said logic gate to invert the test data signal to the data input of the corresponding latching register.

4. The logic cell of claim 3 including a multiplexer circuit having one input coupled to the output signal of the logic cell and another input coupled to the test data signal, said multiplexer operable to couple selectively one of the logic cell output signal and test data signal to the one input of each logic gate.

5. The logic cell of claim 3 wherein each logic gate comprises an exclusive OR gate.

6. The logic cell of claim 1 wherein each latching register includes an enable input operable to enable the latching of the test data signal by each latching register.

7. The logic cell of claim 1 wherein the latching registers are governed by a clock to latch synchronously the test data signal coupled to the data inputs thereof.

8. The logic cell of claim 1 wherein the latching registers are non-enabling; and including a multiplexer circuit for selectively coupling the test data signal to the circuit means.

9. The logic cell of claim 1 wherein the multiple vote circuit comprises a majority vote circuit.

10. The logic cell of claim 1 wherein the odd plurality of latching registers are three latching registers.

11. The logic cell of claim 1 including a means selectively operable for refreshing the latching registers based on the logic cell output signal.

12. The logic cell of claim 11 wherein the refreshing means includes a multiplexer circuit operable to couple selectively the logic cell output signal to the data input of each latching register.

13. The logic cell of claim 1 wherein the test data signal is generated by a scan chain controller over a scan chain; and wherein the circuit means is governed by said scan chain controller using control signals over the scan chain.

14. The logic cell of claim 1 wherein the test data signal is generated by a processor capable of in circuit self testing; and wherein the circuit means is governed by control signals generated by said processor.

15. A scan chain test system for testing at least one multiple voted logic cell of an integrated circuit including a scan chain, said system comprising:

at least one integrated circuit logic cell, coupled to said scan chain, comprising:

an odd plurality of latching registers, each register having a data input for receiving a scan chain data signal from said scan chain and capable of latching said scan chain data signal and generating an output signal representative thereof;

a multiple vote circuit governed by the output signals of said registers for generating an output signal of said logic cell over said scan chain; and circuit means coupled to each said register for altering selectively the scan chain data signal input thereto; and a scan chain test controller operable to apply the scan chain data signal to said at least one logic cell of said integrated circuit and control the value thereof, said controller further operable to control the circuit means for altering selectively the scan chain data signal input to each latching register and for receiving and analyzing the logic cell output signals from said at least one logic cell in response to the applied scan chain data signal and the controlled selective alterations thereof to determine a fault in said at least one logic cell.

16. The system of claim 15 wherein the scan chain data signal is a digital signal; wherein the circuit means of the at least one logic cell comprises means for inverting the scan chain data signal to the data input of at least one selected latching register; and wherein the scan chain test controller is operable to control the latching register selection to which an inverted scan chain data signal is input.

17. The system of claim 16 wherein the inverting means of the at least one logic cell comprises a logic gate coupled to the data input of each latching register, each said logic gate having one data input coupled to the scan chain data signal and another data input coupled to a control line for selectively causing said logic gate to invert the scan chain signal to the data input of the corresponding latching register; and wherein the scan chain test controller is operable to apply control signals over the control lines for selectively inverting the scan chain data signals to the data inputs of the latching registers of the at least one logic cell.

18. The system of claim 17 wherein the at least one logic cell includes a multiplexer circuit having one input coupled to the output signal of the logic cell and another input coupled to the scan chain data signal, said multiplexer operable by said scan chain test controller to couple selectively one of the logic cell output signal and scan chain data signal to the one input of each logic gate.

19. The system of claim 15 wherein each latching register of the at least one logic cell includes an enable input operable by the scan chain test controller to enable the latching of the scan chain data signal by the each latching register.

20. The system of claim 15 wherein the at least one logic cell includes means selectively operable by the scan chain test controller for refreshing the latching registers thereof based on the corresponding logic cell output signal.

21. Method of testing at least one multiple voted logic cell of an integrated circuit, each multiple voted logic cell comprising: an odd plurality of latching registers, each register having a data input for receiving a test data signal and capable of latching said test data signal and generating an output signal representative thereof; and a multiple vote circuit governed by the output signals of said registers for generating an output signal of said logic cell, said method comprising the steps of:

applying the test data signal to the data input of each of the latching registers of at least one multiple voted logic cell of said integrated circuit;

controlling the value of the applied test data signal;

altering selectively the test data signal input to each latching register; and receiving and analyzing the logic cell output signals from said at least one logic cell in response to the applied test data signal and the selective alterations thereof to determine a fault in said at least one logic cell.

22. The method of claim 21 including the steps of:
(a) inverting the test data signal to the data input of one latching register of the at least one logic cell; and
(b) receiving the logic cell output signal from said at least one logic cell in response to the non-inverted and inverted test data signals applied to the latching registers thereof;
(c) repeating steps (a) and (b) for each latching register of the at least one logic cell; and
(d) analyzing the received logic cell output signals from step (b) to determine a fault in the at least one logic cell.

23. The method of claim 21 including the step of enabling each latching register of the at least one logic cell to latch the value of the test data signal applied thereto.

24. The method of claim 21 including the step of selectively refreshing the latching registers of the at least one logic cell based on the corresponding logic cell output signal.

25. The method of claim 21 wherein the test data signal is applied to the data inputs of the latching registers and the value thereof controlled by a scan chain controller over a scan chain; wherein the test data signal is altered selectively to the data inputs of the latching registers by the scan chain controller using control signals over the scan chain; and wherein the logic cell outputs are received and analyzed by the scan chain controller.

26. The method of claim 21 wherein the test data signal is applied to the data inputs of the latching registers and the value thereof controlled by a processor capable of in circuit self testing; wherein the test data signal is altered selectively to the data inputs of the latching registers by the processor using test control signals; and wherein the logic cell outputs are received and analyzed by the processor.

* * * * *

UNITED STATES PATENT AND TRADEMARK OFFICE
CERTIFICATE OF CORRECTION

PATENT NO. : 6,480,019 B2
DATED : November 12, 2002
INVENTOR(S) : Arthur Howard Waldie and Robert Ward James It is certified that error appears in the above-identified patent and that said Letters Patent is hereby corrected as shown below:

<u>Title page,</u>
Item [75], Inventors, "Kuo-Chuan" should read -- Kou-Chuan --;

<u>Column 6,</u>
Line 66, "signed" should read -- signal --.

Signed and Sealed this

First Day of June, 2004

JON W. DUDAS
*Acting Director of the United States Patent and Trademark Office*